(12) United States Patent
Quinlan et al.

(10) Patent No.: US 7,397,300 B2
(45) Date of Patent: Jul. 8, 2008

(54) FSK DEMODULATOR SYSTEM AND METHOD

(75) Inventors: Philip E. Quinlan, Glounthaune (IE); Kenneth J. Mulvaney, Coolaney (IE); Patrick G. Crowley, Mungret (IE); William Hunt, Castleroy (IE)

(73) Assignee: Analog Devices, Inc., Norwood, MA (US)

( * ) Notice: Subject to any disclaimer, the term of this patent is extended or adjusted under 35 U.S.C. 154(b) by 851 days.

(21) Appl. No.: 10/935,545

(22) Filed: Sep. 7, 2004

(65) Prior Publication Data

US 2005/0089120 A1 Apr. 28, 2005

Related U.S. Application Data

(60) Provisional application No. 60/563,031, filed on Apr. 16, 2004, provisional application No. 60/501,444, filed on Sep. 9, 2003.

(51) Int. Cl.
*H03D 3/00* (2006.01)
*H04L 27/14* (2006.01)

(52) U.S. Cl. ............................. 329/300; 375/334

(58) Field of Classification Search ......... 329/300–303; 375/324, 334–337
See application file for complete search history.

(56) References Cited

U.S. PATENT DOCUMENTS

| | | | |
|---|---|---|---|
| 3,571,712 A | 3/1971 | Hellworth et al. |
| 4,054,840 A | 10/1977 | Sato |
| 4,987,374 A | 1/1991 | Burke |
| 5,014,352 A | 5/1991 | Chung |
| 5,053,717 A | 10/1991 | Schulz et al. |
| 6,151,367 A | 11/2000 | Lim |

2005/0089120 A1 * 4/2005 Quinlan et al. .............. 375/335

OTHER PUBLICATIONS

Abidi, Asad A. et al. (eds.), *Integrated Circuits for Wireless Communications*, 1998, IEEE Press.

Lindsey, W.C. et al., *Detection of Digital FSK and PSK using a First-Order Phase-Locked Loop*, IEEE Transactions on Communications, IEEE Transactions on Communications, vol. Com. 25, No. 2 (Feb. 1977).

Liu, Huan-Chang et al., *A Low-Power Baseband Receiver IC for Frequency-Hopped Spread Spectrum Communications*, IEEE, JSSC vol. 31, No. 3 (Mar. 1996).

(Continued)

*Primary Examiner*—David Mis
(74) *Attorney, Agent, or Firm*—Iandiorio Teska & Coleman

(57) ABSTRACT

An FSK demodulator system with tunable spectral shaping including a pair of quadri-correlators responsive to first and second quadrature signals, one of the pair deriving first and second signals representative of the frequency deviation of the quadrature signals at even integer multiples of the frequency deviation and for resolving the modulated FSK data represented by the quadrature signals and the other of the pair deriving first and second signals representative of the frequency deviation of the quadrature signals at odd integer multiples of the deviation frequency and for resolving the modulated FSK data represented by the quadrature signals, and a delay control circuit for setting a delay to each of the pair of quadri-correlators to control the first and second signals representative of the frequency deviation of the quadrature signals derived by each of the pair of quadri-correlators and generate a tuned spectral response at both even and odd integer multiples of the frequency deviation.

47 Claims, 7 Drawing Sheets

OTHER PUBLICATIONS

Sheaffer, C.F., *The Zero-Beat Method of Frequency Discrimination,* Proceedings of the I.R.E., pp. 365-367 (Aug. 1942).

Richman, D., *Color Carrier Reference Phase Synchronization Accuracy in NTSC Color Television,* Proceedings of the I.R.E., pp. 106-133 (Jan. 1954).

Gardner, F.M., *Properties of Frequency Difference Detectors,* IEEE Transactions on Communications, vol. Com.-33, No. 2 (Feb. 1985).

Natali, F., D. *AFC Tracking Algorithms,* IEEE Transactions on Communications, vol. Com.-32, No. 8 (Aug. 1984).

Ling, F., *Convergence and Output MSE of Digital Frequency-Locked Loop for Wireless Communications,* Vehicular Technology Conference, vol. 2 (Apr. 28-May 1, 1996).

Darabi, H., et al., *An IF FSK Demodulator for Bluetooth in 0.35 um CMOS,* IEEE Custom Integrated Circuits Conference, pp. 523-526 (May 2001).

Park, J. et al., *A 5-MHz IF Digital FM Demodulator,* IEEE JSSC, vol. 34, No. 1 (Jan. 1999).

Quinlan, P. et al., *A 17mA, Multi-Mode, 0.3-100Kbps Transceiver for 433/868/915 Mhz ISM Bands in 0.25u CMOS,* JSSC (Apr. 19, 2004).

* cited by examiner

US 7,397,300 B2

FSK DEMODULATOR SYSTEM AND METHOD

RELATED APPLICATIONS

This application claims priority of U.S. Provisional Application No. 60/501,444 filed Sep. 9, 2003, and U.S. Provisional Application No. 60/563,031 filed Apr. 16, 2004, both incorporated by reference herein.

FIELD OF THE INVENTION

This invention relates generally to an FSK demodulator and more particularly to an improved FSK demodulator system and method with programmable spectral shaping.

BACKGROUND OF THE INVENTION

Frequency shift keying (FSK) modulation is a method often used to transmit digital data over a communications link. The data is typically transmitted on a carrier signal which includes positive and negative frequency deviations that represent the digital data. FSK demodulation is a technique used to extract the digital representation of the transmitted data by measuring the frequency deviations.

Typical prior art techniques for FSK demodulation include, inter alia, tracking PLLs, tuned LC tank discriminators, matched filters, and quadri-correlators. One example of a conventional FSK demodulation technique is to employ a loop-filter voltage in a tracking PLL as the demodulator output voltage. The PLL bandwidth is optimized to track the input frequency changes and the received bit stream can be recovered by threshold detecting the loop filter output voltage. However, additional filtering of the loop filter voltage is typically required before the signal can be reliably detected by a slicer with good signal to noise ratio (SNR). Moreover, frequency aided acquisition is typically required to achieve fast lock time to the message preamble. The result is an increase in the overall complexity and power dissipation of the tracking PLL. Such a design does not perform well with integrated receiver architectures that operate with near zero IF due to the large time constants involved.

Conventional LC tank discriminators may also be utilized for frequency demodulation. However, some form of tuning or calibration is usually required to optimize the discriminator gain and to center the data slicer threshold at the IF frequency. Moreover, while tuned LC tank resonators have been successfully integrated in CMOS technology, the silicon area of a fully integrated LC tank discriminator is prohibitive for practical applications. The LC tuned circuit also consumes significant power and does not operate well with low power and/or low IF receiver designs.

Quadri-correlators are often employed in FSK demodulators because they are less complex in design and utilize less power. A typical FSK demodulator which incorporates a quadri-correlator, such as U.S. Pat. No. 4,987,334, incorporated herein by reference, employs a design which is centered around a zero IF. Operating at zero IF produces DC offset and the problems associated therewith, as well as low frequency noise when CMOS technology is employed. Other prior art FSK demodulators which employ quadri-correlators overcome the problems associated with operating at zero IF frequencies by operating at high IF. However, at high IF the power dissipation becomes a problem.

Another conventional FSK demodulator is disclosed in U.S. Pat. No. 5,053,717, incorporated by reference herein. The '717 patent employs a DC offset correction loop with a demodulator to minimize DC offsets at the output of the demodulator. In this design, a DC offset correction loop must be utilized because the multiplier inputs are operating at baseband (zero IF). However, implementing the DC offset correction loop requires an additional analog-to-digital converter, amplifier and filter which increases the overall complexity and power dissipation of the system.

Conventional FSK demodulators/frequency discriminators which employ quadri-correlators typically exhibit a linear frequency to voltage characteristic and therefore do not perform spectral shaping or filtering of the FSK spectrum to maximize the demodulator output SNR.

SUMMARY OF THE INVENTION

It is therefore an object of this invention to provide an improved FSK demodulator system and method.

It is a further object of this invention to provide such a demodulator system with inherent spectral shaping.

It is a further object of this invention to provide such a demodulator system with inherent spectral shaping that maximizes the demodulator's output signal-to-noise ratio.

It is a further object of this invention to provide such a system which generates a composite spectral response that combines both even and odd integer multiples of the frequency deviation.

It is a further object of this invention to provide such a system which provides a predetermined spectral response at any non-integer multiples of the frequency deviation.

It is a further object of this invention to provide such a demodulator system which provides tunable spectral shaping to optimize the output signal-to-noise ratio.

It is a further object of this invention to provide such a demodulator system which provides tunable spectral shaping to optimize the output signal-to-noise ratio.

It is a further object of this invention to provide such a demodulator system which approximates a matched filter response and provides a maximum output signal-to-noise ratio.

It is a further object of this invention to provide such a system which utilizes less space.

It is a further object of this invention to provide such a system which uses less power.

It is a further object of this invention to provide such a demodulator system which operates over a wide range of data rates at a fixed frequency deviation.

It is a further object of this invention to provide such a demodulator system which operates over a wide range of frequency deviations at a fixed data rate.

It is a further object of this invention to provide such a demodulator system which operates over a wide range of the modulation index.

The invention results from the realization that a truly innovative FSK demodulator system with tunable spectral shaping can be achieved with a pair of quadri-correlators responsive to first and second quadrature signals for deriving signals representative of the frequency deviation of the quadrature signals and resolving the digital values represented by the quadrature signals, and a delay circuit for setting the delay of each of the pair of the quadri-correlators to control the signals representative of the frequency of the quadrature signals at integer multiples of the frequency deviation to provide a predetermined spectral response. This invention results from the further realization that an improved FSK demodulator system with tunable spectral shaping which improves the output SNR and operates over a wide range of frequency deviations and a wide range of the modulation index can be achieved by employing a limiter for providing digital quadrature signals at a predetermined IF frequency varied by positive and negative frequency deviations, a sine and cosine pair of quadri-correlators responsive to the digital quadrature signals, each of which derive signals representative of the frequency deviation of quadrature signals at even or odd integer multiples or sub-multiples of the frequency deviation about the IF frequency and resolve the FSK modulated data represented by the quadrature signals, a delay circuit for setting the delay of each of the sine and cosine correlators to control the signals representative of the frequency deviation of the quadrature signals, and a plurality of scaling circuits responsive to the sine and cosine pair of quadri-correlators that introduce programmable scaling coefficients to weight the output of each of the pair of correlators and generate a composite tuned spectral response that combines the even and odd integer multiples of the frequency deviation.

This invention features an FSK demodulator system with tunable spectral shaping including a pair of quadri-correlators responsive to first and second quadrature signals, one of the pair deriving first and second signals representative of the frequency deviation of the quadrature signals at even integer multiples of the frequency deviation and for resolving the modulated FSK data represented by the quadrature signals and the other of the pair deriving first and second signals representative of the frequency deviation of the quadrature signals at odd integer multiples of the deviation frequency and for resolving the modulated FSK data represented by the quadrature signals, and a delay control circuit for setting a delay to each of the pair of quadri-correlators to control the first and second signals representative of the frequency deviation of the quadrature signals derived by each of the pair of quadri-correlators and generate a tuned spectral response at both even and odd integer multiples of the frequency deviation.

In one embodiment, the FSK demodulator system may include an analog-to-digital converter responsive to first and second quadrature signals at a predetermined IF frequency varied by positive and negative frequency deviations for generating digital first and second quadrature signals. The system may include a plurality of scaling circuits responsive to the pair of quadri-correlators for introducing programmable scaling coefficients to the output of each of the pair correlators to weight the first and second signals representative of the frequency deviation generated by each of the pair of correlators to generate a composite tuned spectral response that combines the even and odd integer multiples of the frequency deviation. One of the pair of quadri-correlators may include a cosine correlator. One of the pair of quadri-correlators may include a sine correlator. The delay circuit may generate a programmable delay for the sine correlator which is equal to $\tau_1$, where $$\tau_1 = \frac{1}{4(f_{dev})},$$

and where $f_{dev}$ is the frequency deviation. The delay circuit may generate a programmable delay for the cosine correlator which is equal to $\tau_2$, where $$\tau_2 = \frac{1}{4(f_{dev})},$$

and where $f_{dev}$ is the frequency deviation. The frequency deviation may be optimized to equal the IF frequency divided by a predetermined number. The predetermined number may be chosen from the group consisting of an odd integer, an even integer, and a real number. The frequency deviation may have a frequency in the range of about 100 Hz to 5 MHz. The scaling coefficients may be values between −1 and +1. The system may include an adder circuit responsive to the plurality of scaling circuits for linearly combining the outputs of the pair of quadri-correlator to provide the composite spectral response and maximize the output signal-to-noise ratio. The IF frequency may be greater than zero. The IF frequency may be in the range of about 100 kHz to 10 MHz. The IF frequency may be zero. The analog-to-digital converter may include a limiter. The analog-to-digital converter may include a one bit analog-to-digital converter. The analog-to-digital converter may include a saturated an analog-to-digital converter. The cosine quadri-correlator may be responsive to first and second quadrature signals and generates a cosine frequency response. The ratio of the IF frequency to the frequency deviation may be an odd integer multiple, an even integer multiple, a real number, or a fractional number having a fractional part greater than zero. The sine correlator may be responsive to first and second quadrature signals and generates a sinusoidal frequency response. Each of the pair of quadri-correlators may include first and second delay circuits responsive to the first and second quadrature signals for generating delayed first and second quadrature signals, first and second multiplier circuits responsive to the first and second quadrature signals and first and second delayed quadrature signals for deriving first and second signals representative of the frequency deviation of the quadrature signals, and a summer circuit responsive to the first and second signals representative of the frequency deviation of the quadrature signals for resolving the modulated FSK data represented by the quadrature signals. The system may operate at a modulation index in the range of about 0.1 to 50. The delay and the scaling coefficients may be adjusted to maximize the output signal-to-noise ratio over a modulation index in the range of 0.1 to 50. The FSK demodulator system may enable FSK demodulation, and/or Gaussian Frequency Shift Keying (GFSK) demodulation and/or Minimum Shift Keying (MSK) demodulation, and/or Phase Shift Keying (PSK) demodulation. The FSK demodulator system may include a low pass filter responsive to the adder circuit for removing noise and harmonics from the tuned spectral response. The system may include a slicer circuit responsive to the low pass filter for recovering the modulated FSK data and generating a recovered bit stream. The system may include a digital PLL responsive to the recovered bit stream for generating a clock signal and a data signal. The system may include a quadrature receiver responsive to a high frequency FSK signal varied by positive and negative frequency deviations which represent modulated FSK data for converting the high frequency FSK signal the first and second quadrature signals at a predetermined IF frequency.

This invention also features an FSK demodulator system with tunable spectral shaping including an analog-to-digital converter responsive to first and second quadrature signals at a predetermined IF frequency varied by positive and negative frequency deviations for generating digital first and second quadrature signals, a pair of quadri-correlators responsive to the digital first and second quadrature signals, one of the pair deriving first and second signals representative of the frequency deviation of the quadrature signals at even integer multiples of the frequency deviation and for resolving the modulated FSK data represented by the quadrature signals and the other of the pair deriving first and second signals representative of the frequency deviation of the quadrature signals at odd integer multiples of the deviation frequency and for resolving the modulated FSK data represented by the quadrature signals, and a delay control circuit for setting a delay to each of the pair of quadri-correlators to control the first and second signals representative of the frequency deviation of the quadrature signals derived by each of the pair of quadri-correlators and generate a tuned spectral response at both even and odd integer multiples of the frequency deviation.

This invention further features an FSK demodulator system with tunable spectral shaping including a analog-to-digital converter responsive to first and second quadrature signals at a predetermined IF frequency varied by a positive and negative frequency deviations for generating digital first and second quadrature signals, a sine and cosine pair of quadri-correlators responsive to the digital first and second quadrature signals each of the pair deriving first and second signals representative of the frequency deviation of the quadrature signals at even or odd integer multiples or sub-multiples of the frequency deviation about the IF frequency and for resolving the modulated FSK data represented by the quadrature signals, a delay control circuit for setting a delay to each of the sine and cosine pair of quadri-correlators for controlling the first and second signals representative of the frequency deviation of the quadrature signals, and a plurality of scaling circuits responsive to the sine and cosine pair of quadri-correlators for introducing programmable scaling coefficients to the output of each of the pair correlators to weight the first and second signals representative of the frequency deviation generated by each of the pair of correlators to generate a composite tuned spectral response that combines the even and odd integer multiples of the frequency deviation.

In one embodiment, the system may include an adder circuit responsive to the plurality of scaling circuits for lineally combining the outputs of the sine and cosine pair of quadri-correlators to generate the composite spectral response. The system may include a qaudrature receiver responsive to a high frequency FSK signal varied positive and negative frequency deviations which represent modulated FSK data for converting the high frequency FSK signal to the first and second quadrature signal at the predetermined IF frequency. The analog-to-digital converter may include a limiter. The analog-to-digital converter may include a saturated analog-to-digital converter.

This invention also features an FSK demodulator system with tunable spectral shaping including an analog-to-digital converter responsive to first and second quadrature signals at a predetermined IF frequency varied by a positive and negative frequency deviations for generating digital first and second quadrature signals, a sine and cosine pair of quadri-correlators responsive to the digital first and second quadrature signals each of the pair deriving first and second signals representative of the frequency deviation of the quadrature signals at even or odd integer multiples or sub-multiples of the frequency deviation about the IF frequency and for resolving the modulated FSK data represented by the quadrature signals, a delay control circuit for setting a delay to each of the sine and cosine pair of quadri-correlators for controlling the first and second signals representative of the frequency deviation of the quadrature signals, a plurality of scaling circuits responsive to the sine and cosine pair of quadri-correlators for introducing programmable scaling coefficients to the output of each of the pair correlators to weight the first and second signals representative of the frequency deviation generated by each of the pair of correlators, and an adder circuit responsive to the plurality of scaling circuits for lineally combining the outputs of the sine and cosine pair of quadri-correlators to generate a composite spectral response that combines the even and odd integer multiples of the frequency deviation.

This invention further features an FSK demodulator system with tunable spectral shaping including a plurality of correlators, each the correlator including a sine and cosine correlator responsive to first and second quadrature signals at a predetermined IF frequency varied by positive and negative frequency deviations, each of the sine and cosine correlators deriving first and second signals representative of the frequency deviation of the quadrature signals at even or odd integer multiples or sub-multiples of the frequency deviation about the IF frequency and for resolving the modulated FSK data represented by the quadrature signals, a delay control circuit for setting a programmable delay to each of the sine and cosine correlators for controlling and maximizing the first and second signals representative of the frequency deviation of the quadrature signals, and a plurality of scaling circuits responsive to each of the sine and cosine correlators for introducing programmable scaling coefficients to the output of each of the sine and cosine correlators to weight the first and second signals representative of the frequency deviation generated by each of the sine and cosine correlators and generate a lineally combined composite spectral response that combines the outputs of each of the plurality of correlators and approximates a matched filter response.

This invention further features an FSK demodulator system with tunable spectral shaping including an analog-to-digital converter responsive to analog-to-digital converter a predetermined IF frequency varied by a positive and negative frequency deviations for generating digital first and second quadrature signals, a plurality of correlators, each the correlator including a sine and cosine correlator responsive to the digital first and second quadrature signals at a predetermined IF frequency, each of the sine and cosine correlators deriving first and second signals representative of the frequency deviation of the quadrature signals at even or odd integer multiples or sub-multiples of the frequency deviation about the IF frequency and for resolving the modulated FSK data represented by the quadrature signals, a delay control circuit for setting a programmable delay to each of the sine and cosine correlators for controlling and maximizing the first and second signals representative of the frequency deviation of the quadrature signals, and a plurality of scaling circuits responsive to each of the sine and cosine correlators for introducing programmable scaling coefficients to the output of each of the sine and cosine correlators to weight the first and second signals representative of the frequency deviation generated by each of the sine and cosine correlators and generate a lineally combined composite spectral response that combines the outputs of each of the plurality of correlators and approximates a matched filter response.

In one embodiment, the system may include an adder circuit responsive to the plurality of scaling circuits for lineally combining the outputs of each of the plurality of correlators for generating the lineally combined composite response. The analog-to-digital converter may include a limiter, the analog-to-digital converter may include a saturated analog-to-digital converter. The system may include a low pass filter response to the adder circuit for removing noise and harmonics from the lineally combined composite response.

This invention further features an FSK demodulator method including the steps of deriving first and second signals representative of the frequency deviation of first and second quadrature signals at even integer multiples of the frequency deviation and resolving the modulated FSK data represented by the quadrature signals, deriving first and second signals representative of the frequency deviation of first and second quadrature signs at odd integer multiples of the frequency deviation and resolving the modulated FSK data represented by the quadrature signals, and setting a delay to control the first and second signals representative of the frequency deviation at the even and odd multiples of the frequency deviation to generate a tuned spectral response that combines the even and odd integer multiples of the frequency deviation.

In one embodiment, the method may further include the step of introducing scaling coefficients to weight the first and second signals representative of the deviation frequency the even or odd integer multiples or sub-multiples of the frequency deviation about a predetermined IF frequency to generate a composite spectral response that combines the even and odd integer multiples of the deviation frequency.

BRIEF DESCRIPTION OF THE DRAWINGS

Other objects, features and advantages will occur to those skilled in the art from the following description of a preferred embodiment and the accompanying drawings, in which.

DISCLOSURE OF THE PREFERRED EMBODIMENT

Figure 1:
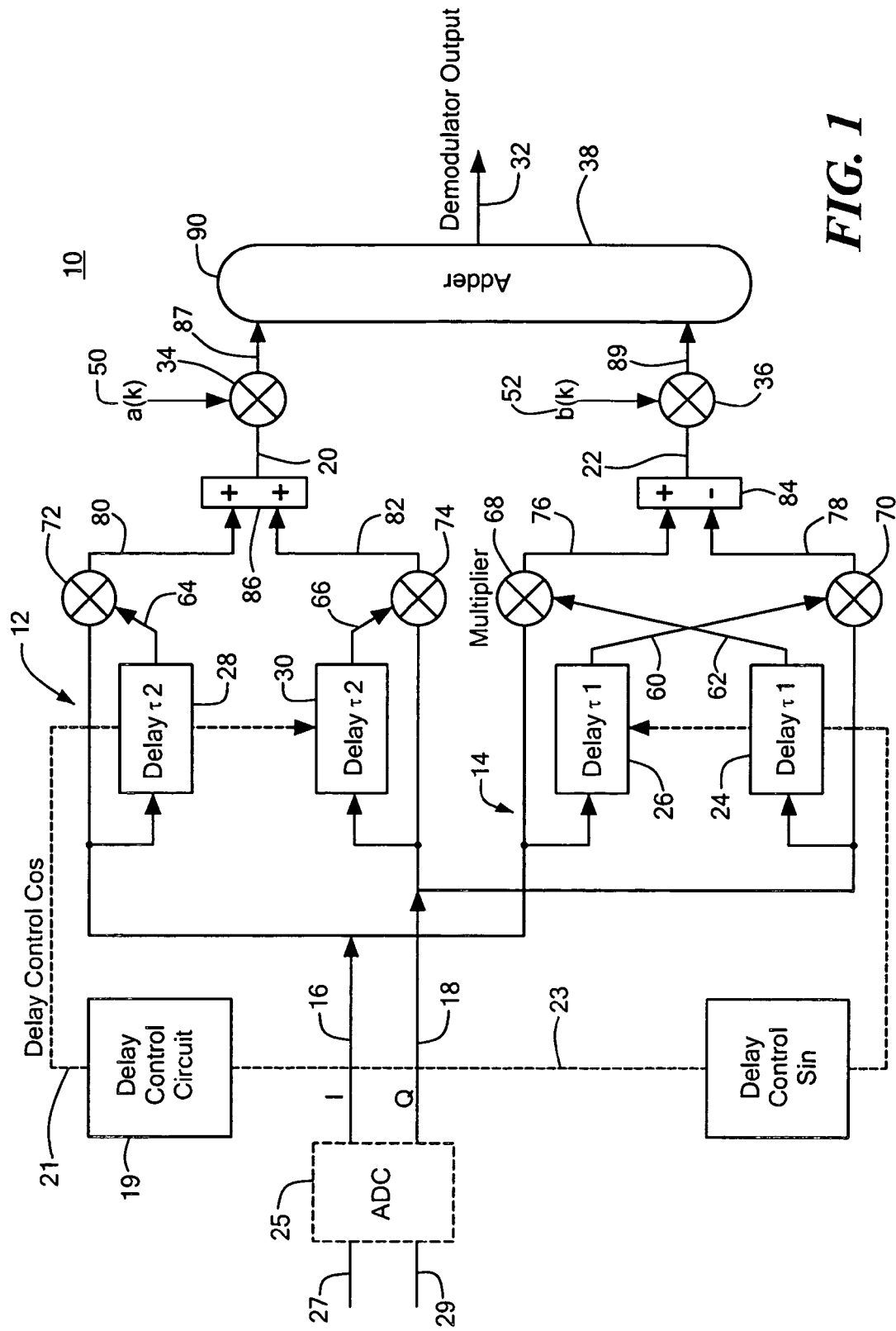
FIG. 1 is a schematic block diagram of one embodiment of the FSK demodulator system of this invention employing a combined sine and cosine quadri-correlator.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings.

There is shown in FIG. 1, FSK demodulator system 10 of this invention with tunable spectral shaping. System 10 includes a pair of quadri-correlators, such as cosine correlator 12 and sine correlator 14, each of which are responsive to first quadrature signal (I) on line 16 and second quadrature signal (Q) on line 18. The first and second quadrature signals on lines 16 and 18 are typically digital signals which have been converted from first and second quadrature signals on lines 27 and 29 by analog-to-digital converter 25. Ideally, analog-to-digital converter 25 is a limiter or a saturated analog-to-digital converter, as discussed in further detail below. The first and second quadrature signals on lines 27 and 29 are typically at a predetermined IF frequency, e.g., between 100 kHz and 10 MHz which are varied by positive and negative frequency deviations, e.g., between 100 Hz and 5 MHz, which represent modulated FSK data. Sine correlator 14 derives first and second signals representative of the frequency deviation of the quadrature signals on lines 76 and 78 at even integer multiples of the frequency deviation and resolves the FSK modulated data (e.g., a bit stream) represented by the quadrature signals on line 22 (discussed in detail below). Cosine correlator 12 derives first and second signals on lines 80 and 82 which are representative of the frequency deviation of the quadrature signals at odd integer multiplies of the frequency deviation and similarly resolves the FSK modulated data represented by the quadrature signals on line 20, also discussed in further detail below.

Although as discussed above cosine correlator 12 and sine correlator 14 of system 10 are responsive to digital first and second quadrature signals on lines 16 and 18, this is not a necessary limitation of this invention, as cosine correlator 12 and sine correlator 14 may be responsive to analog quadrature signals or a combination of analog and digital quadrature signals. Moreover, although the quadrature signals are ideally converted from an FSK signal having an IF frequency between 100 kHz and 10 MHz which minimizes DC offset problems and mitigates noise problems in a typical CMOS implementation of system 10, this is not a necessary limitation of this invention, as system 10 may operate with an FSK signal having a zero IF frequency.

Delay control circuit 19 generates on line 21 a programmable delay, $\tau_2$, to cosine correlator 12, where $\tau_2$ is equal to $$\frac{1}{4(f_{dev})},$$

and where $f_{dev}$ is the frequency deviation of the quadrature signals on lines 16 and 18 from the IF frequency. Similarly, delay control circuit 19 generates on line 23 a programmable delay, $\tau_1$, to control sine correlator 14, where $\tau_1$ is equal to $$\frac{1}{4(f_{dev})}.$$

Figure 2:
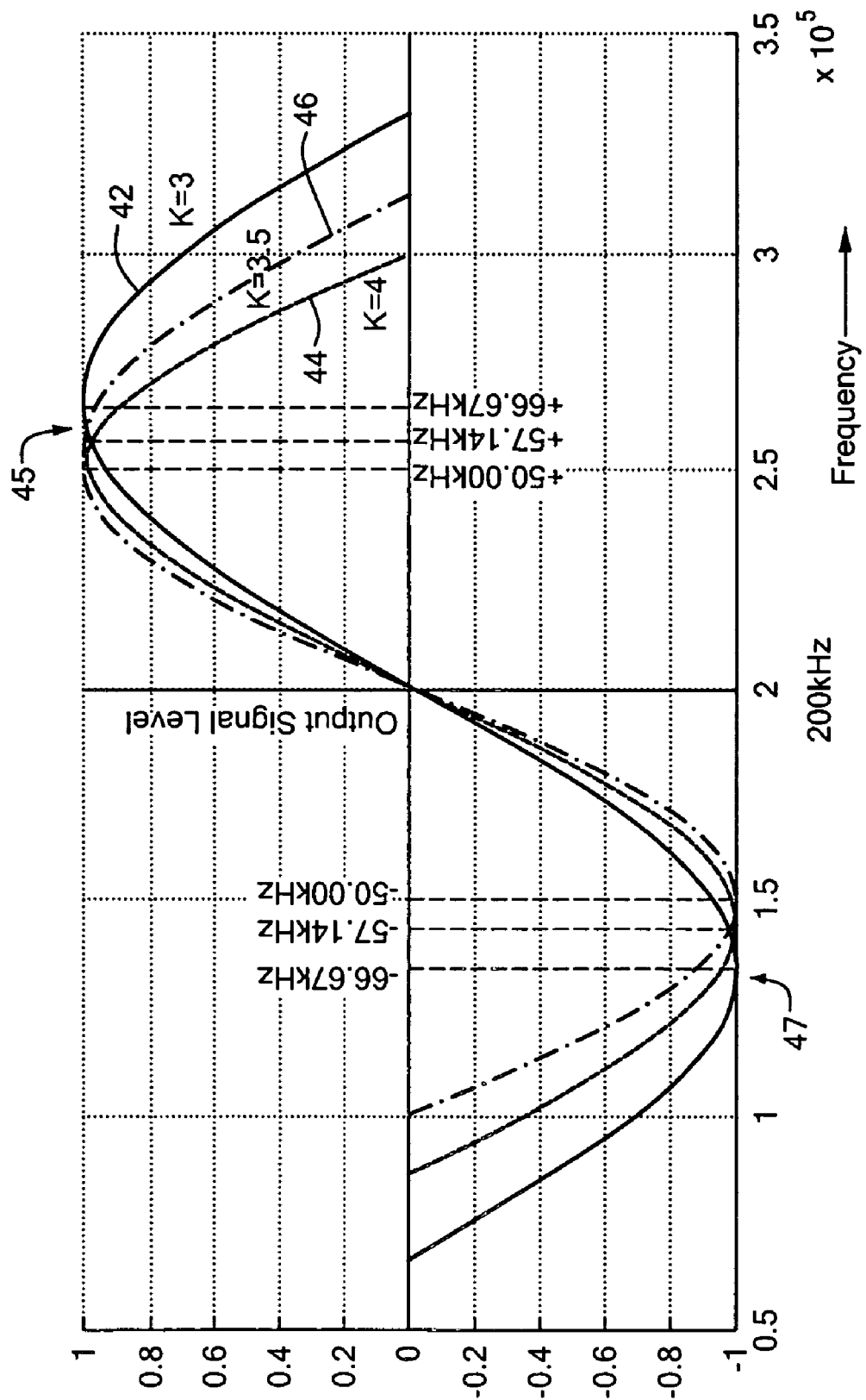
FIG. 2 is a graph showing an example of the frequency response of the FSK demodulator system shown in FIG. 1.

The delay on line 23, e.g., delay $\tau_1$ sets a delay to first delay circuit 24 and second delay circuit 26 of sine correlator 14 to control the first and second signals on lines 76 and 78 which represent the frequency deviation of the quadrature signals on line 16 and 18. The delay on line 21, e.g., $\tau_2$, sets a delay to first delay circuit 28 and second delay circuit 30 of cosine correlator 12 to control the first and second signals on lines 80 and 82 which represent the frequency deviation of the quadrature signals on lines 16 and 18. Applying delays $\tau_2$ and $\tau_1$ to cosine correlator 12 and sine correlator 14, respectively, provides a tuned spectral response at both even and odd integer multiples of the frequency deviation of the quadrature signals. Graph 42, FIG. 2 shows one example of a tuned spectral response at an odd integer multiples of the frequency deviation and graph 44 shows an example of a tuned spectral response at an even integer multiple of the frequency deviation. In this example the signal amplitude, indicated at 45, is normalized to 1. The result is an improved SNR of the output signal on line 32, FIG. 1 generated by system 10. System 10 also is less complex than conventional FSK demodulators and hence utilizes less chip space and consumes less power.

Sine correlator 14 typically includes first delay circuit 24 and second delay circuit 26 responsive to the quadrature signals on lines 16 and 18 and generates delayed first and second quadrature signals on lines 60 and 62. Multiplier circuits 68 and 70 are responsive to the quadrature signals on lines 16 and 18 and the delayed quadrature signals on lines 60 and 62 and derive the first and second signals on lines 76 and 78 which represent the frequency deviation of the quadrature signals. Sine correlator 14 also includes subtraction circuit 84 which is responsive to the first and second signals representative of the frequency deviation on lines 76 and 78 and resolves the FSK modulated data represented by quadrature signals on lines 16 and 18. Sine correlator 14 is referred to as a sine correlator because it generates a sinusoidal frequency response. Sine correlator 14 has a frequency response at line 22 defined by the equation:

$$Vo \, Sin(f) = A^2 \, Sin(2\pi f_i \tau_1) \quad (1)$$

where A is the signal amplitude, fi is the frequency of the quadrature signals on lines 16 and 18, and $\tau_1$ is the delay, e.g., $\tau_1$ as described above. The output of sine correlator 14 may be maximized when the IF frequency is equal to and integer ratio, K of the frequency deviation such that the input frequency is equal to $Kf_{dev} \pm f_{dev}$, where K is even, e.g., K={0, 2, 4, 6 or 8, ...}.

Cosine correlator 12 typically includes first delay circuit 28 and second delay circuit 30 responsive to the quadrature signals on lines 16 and 18 and generates delayed first and second quadrature signals on lines 64 and 66. Multiplier circuits 72 and 74 responsive to the quadrature signals on lines 16 and 18 and the delayed quadrature signals on lines 64 and 66 to derive the first and second signals on lines 80 and 82 representative of the frequency deviation of the quadrature signals. Cosine correlator 12 also includes adder circuit 86 which is responsive to the first and second signals representative of the frequency deviation on lines 80 and 82 and resolves the FSK modulated data represented by quadrature signals on lines 16 and 18. Cosine correlator 12 is referred to as a cosine correlator because it generates a cosine frequency response. Cosine correlator 12 has a frequency response at line 20 defined by the equation:

$$Vo \, Cos(f) = A^2 \, Cos(2\pi f_i \tau_2) \quad (2)$$

where A is the signal amplitude, fi is the frequency of the quadrature signal and $\tau_2$ is the delay, e.g., $\tau_2$ as described above. The output of cosine correlator 12 may be maximized when the IF frequency is an integer ratio K of the frequency deviation such that the input frequency is equal to $Kf_{dev} \pm f_{dev}$, where K is odd, e.g., K={1, 3, 5, ...}.

Although as discussed above, FSK demodulator system 10 may perform binary FSK or Gaussian FSK (GFSK) demodulation, both of which are forms of BFSK demodulation, e.g., BFSK may describe FSK system 10 of this invention, as described above, where two frequencies are used to represent a digital 1 or 0, this is not a necessary limitation of this invention, as FSK demodulator system 10 may be used as an MFSK demodulator (Multi-level FSK demodulator), e.g., system 10 uses four different frequencies to represent four 2-bit symbols, such as 00, 01, 10, 11, or an eight FSK demodulation for 3 bits/symbol or sixteen FSK demodulation for 4 bits/symbol, and the like, as known to those skilled in the art. System 10 may also be modified to provide phase-shift keying (PSK) demodulation by integrating the output signal level on line 32 and threshold-detecting (slicing) the output. For example, PSK demodulation-(and all variants of phase demodulation) may be implemented in accordance with system 10 of this invention by performing an integrate and dump operation of the output signal on line 32 of FSK demodulator system 10.

FSK demodulator system 10 may also include a plurality of scaling circuits, such as scaling circuit 34 responsive to the output of cosine correlator 12 on line 20 and scaling circuit 36 responsive to the output of sine correlator 14 on line 22. Scaling circuits 34 and 36 introduce programmable scaling coefficients, e.g., a(k), indicated at 50, and b(k), indicated at 52, which weight the outputs of correlators 12 and 14 to generate a composite tuned spectral response that combines the even and odd integer multiples of frequency deviations. For example, scaling coefficient a(k), indicated at 50, is introduced to scaling circuit 34 to provide a weighting factor of the output of cosine correlator 12 on line 87 and scaling coefficient b(k), indicated at 52 is introduced to scaling circuit 36 to weight the output of sine correlator 14 on line 89. Adder circuit 90 is connected to the outputs of scaling circuits 34 and 36 by lines 87 and 89, respectively, and linearly combines the outputs of scaling circuits 34 and 36 of cosine correlator 12 and sine correlator 14, respectively, to generate the composite tuned spectral response on line 32. The result is a programmable composite tuned spectral response on line 32 which is a combination of the weighted values of the outputs of cosine correlator 12 and sine correlator 14 that is a combination of the even and odd integer multiples of the frequency deviation. The scaling coefficients are typically any value between negative 1 and positive 1. For example, graph 46, FIG. 2, shows a tuned composite spectral response that is a combination of even and odd integer multiples of the frequency deviation, e.g., at a multiple of 3.5 times the frequency deviation. In this example, the signal amplitude is normalized to 1, e.g., $A^2=1$ in equation (1) and (2) above. Table 1 below summarizes one example of system 10 of this invention with various values chosen for programmable delays $\tau_1$ and $\tau_2$ and scaling coefficients a(k) and b(k). In general, the response of system 10 can be optimized for a frequency deviation $F_{dev}=IF/K$, where K can be an even or odd integer or a real number and the IF frequency is greater than zero. However, as discussed above, the IF frequency may be zero, which in this example, K would also be equal to zero. In this example, FSK demodulator system 10 has been optimized for three different frequencies, e.g., IF/3.0, IF/3.5 and IF/4.0 which corresponds to frequency deviations of 66.67 kHz, 57.14 kHz and 50.0 kHz, respectively. In this example the IF of the first and second quadrature signals is equal to about 200 kHz, although system 10 may operate at zero IF with the same frequency deviation. Typically, the frequency deviation may be any frequency between 100 Hz and 5 MHz. The result is an improved SNR output of FSK demodulator system 10, FIG. 1 when the frequency deviation is equal to IF/K for even and odd valued of K.

TABLE 1

| K | Frequency Deviation | $\tau_1$ | $\tau_2$ | a(k) | b(k) |
|---|---|---|---|---|---|
| 4.0 | $f_{dev}$ = IF/4.0 = 50.00 kHz | 1/(4*50.0 kHz) | N/A | 0.0 | 1.0 |
| 3.5 | $f_{dev}$ = IF/3.5 = 57.14 kHz | 1/(4*50.0 kHz) | 1/(4*66.67 kHz) | 0.585 | 0.440 |
| 3.0 | $f_{dev}$ = IF/3.0 = 66.67 kHz | N/A | 1/(4*66.67 kHz) | 1.0 | 0.0 |

The overall frequency response of FSK demodulator system 10 on line 32 is governed by the following equation which incorporates equations (1) and (2) above:

$$Vo(f) = a(k)A^2 \, Cos(2\pi f_i \tau_2) + b(k)A^2 \, Sin(2\pi f_i \tau_1)$$

where Vo(f) is the output on line 32 and a(k) and b(k) are the scaling coefficients as described above.

Because FSK demodulator system 10 of this invention linearly combines the outputs of the sine correlator 14 and cosine correlator 12 the frequency response can be optimized for a wide range of FSK deviation frequencies by choosing the value of the delays $\tau_1$, $\tau_2$ and the coefficients a(k), b(k), as described above. Moreover, the resulting frequency response of FSK demodulator system 10 of this invention approximates that of a two matched filters that are tuned to each of the binary FSK tone frequencies IF±$F_{dev}$, which maximizes the output SNR of FSK demodulation system 10.

Figures 3, 3A:
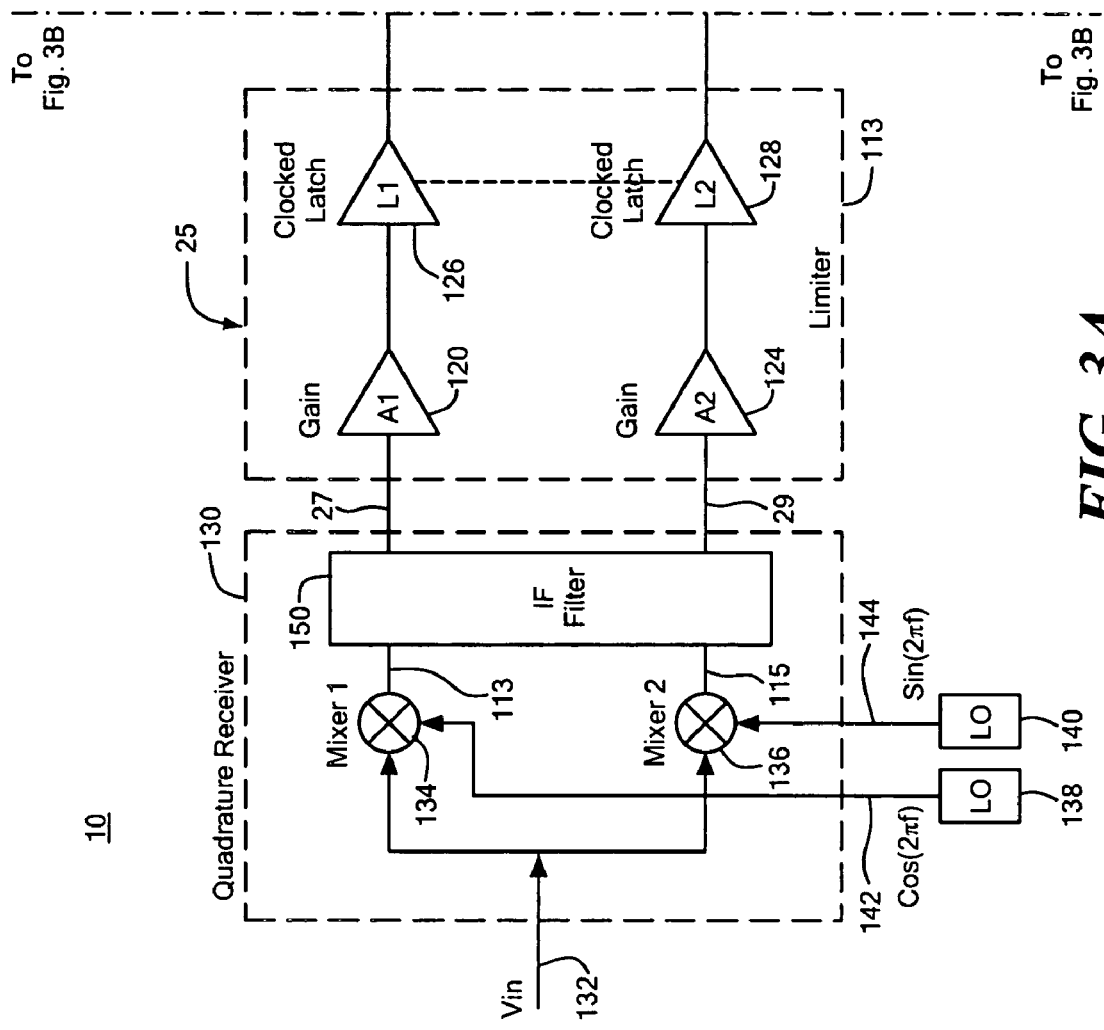
FIG. 3 is a schematic block diagram of another embodiment of the FSK demodulator system of this invention using two quadri-correlators to obtain odd, even, and non-integer multiples of the frequency deviation on an FSK signal.
Figure 3B:
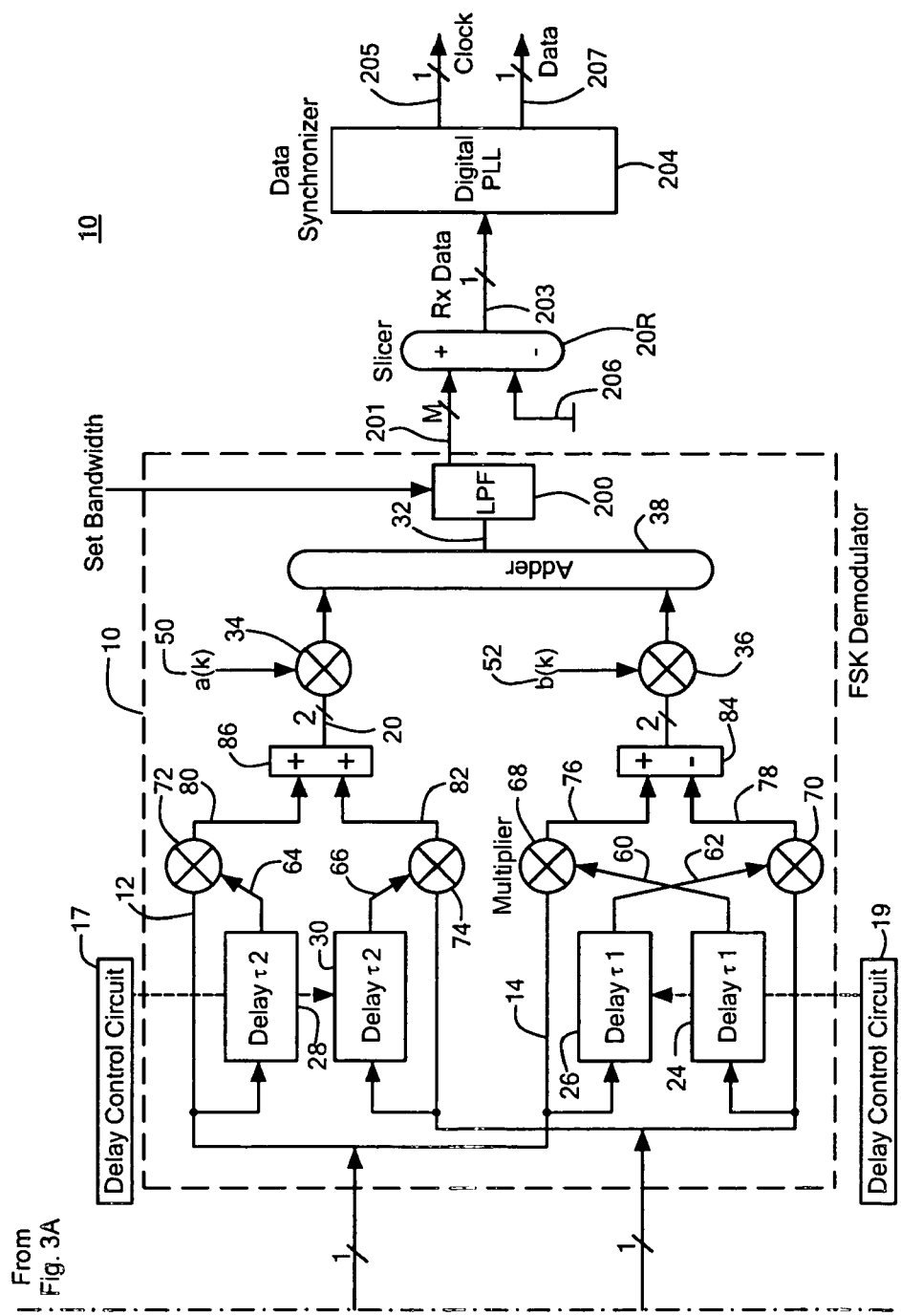

FSK demodulator system 10', FIG. 3, where like parts have been given like numbers, of this invention may include analog-to-digital converter 25, as described above, responsive to IF signals on lines 27 and 29 which have an average frequency equal to a pre-determined frequency, e.g., a signal having an average frequency between 100 kHz and 10 MHz, such as 200 kHz, or alternatively having an average frequency of zero, which are varied by positive and negative frequency deviations, e.g., frequency deviations having a frequency between 100 Hz and 5 MHz, such as 50 kHz, and generates digital first and second quadrature signals on lines 16 and 18. Analog-to-digital converter 25 may be configured as a limiter, as indicated by dashed box 113, which includes gain circuits 120 and 124 and clock latch circuits 126 and 128 for providing the digital quadrature signals on lines 16 and 18 and removing unwanted noise (e.g., AM noise). Analog-to-digital converter 25 may include a one bit analog-to-digital converter (limiter) or a saturated analog-to-digital converter.

System 10' may also include quadrature receiver circuit 130 responsive to an FSK signal on line 132, typically generated at a frequency up to several GHz, e.g., to about 2.4 GHz, having a frequency deviation of about 100 Hz to 5 MHz which represent the modulated FSK data (bitstream). Local oscillators 138 and 140 provide signals to mixers 134 and 136 on lines 142 and 144, respectively, for converting the high frequency FSK signal (e.g., $V_{in}$) on line 132 to a desired IF frequency on lines 113 and 115 (e.g., a predetermined IF frequency such as 200 kHz).

IF filter 150 removes unwanted noise to produce clean IF signals on lines 27 and 29. IF filter 150 also provides channel filtering, i.e., attenuating the neighboring unwanted radio channels and image rejection, i.e., attenuating the image channel at the receiver input.

Low pass filter 200, often referred to as a "post demodulation" filter, removes unwanted noise and harmonics from the output signal (demodulated bit stream) on line 32. The bandwidth of low filter 200 may be adjusted and optimized for various user defined data rates. As discussed above, the delay of correlators 12 and 14 is adjusted by delay control circuit 19 to accommodate the FSK frequency deviation. The bandwidth of the low pass filter 200 is adjusted to accommodate the data rate to optimize the performance for various modulation index, where the modulation index equals $(2 \times F_{DEV})/F_{DATA}$, where $F_{DEV}$ is the frequency deviation and $F_{DATA}$ is the frequency of the data (discussed in further detail below). The output on line 32 is typically a multi-level signal that contains signal plus noise, and the like, as described above. The signal at the output of the low pass filter 200 on line 201 will also be a multi-level signal with attenuated noise and unwanted harmonics. The normalized signal range at the output of the low pass filter 200 filter is typically in the range of about −2 to +2. If this signal level is greater than or equal to zero, slicer 202 outputs a logic 1 on line 203. If the signal level is less than zero, slicer 202 outputs a logic 0 on line 203. Thus, slicer 202 converts the signal levels output by low pass filter 200 to a 1 or a 0 on line 203 and recovers the FSK bit stream.

Digital PLL 204 is responsive to the recovered bit stream on line 203 and generates a synchronous clock signal on line 205 and a data signal on line 207 such that the received data can be clocked into a micro-processor (not shown) for data interrogation and processing.

Figure 4:
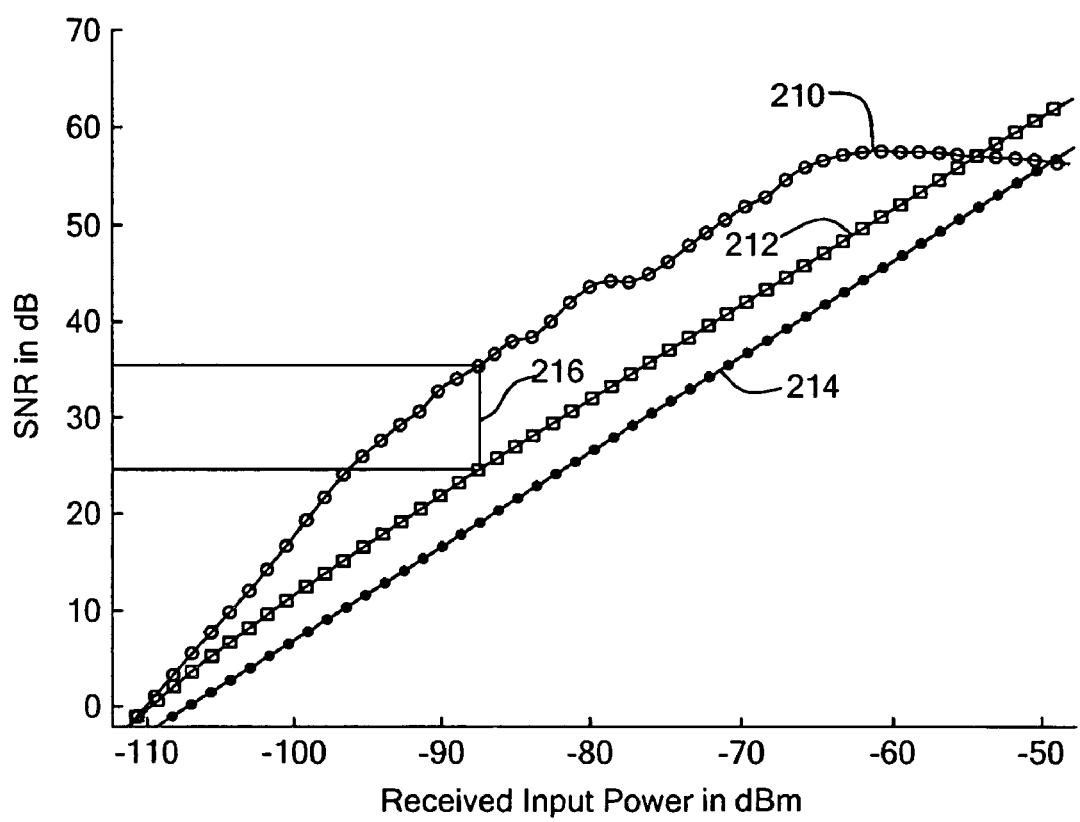
FIG. 4 is a graph showing the improved signal-to-noise ratio generated by the FSK demodulator shown in FIG. 3.

The addition of limiter 113 to system 10' removes unwanted noise (e.g., AM noise) which maximizes the output SNR and removes the requirement for signal normalization. Moreover, the quadri-correlator delay circuits 24, 26, 28 and 30, multiplier circuits 68, 70, 72, and 74, subtraction circuit 84 and adder circuit 86 operate with one to two bits of precision which saves power, and minimizes complexity which reduces the required silicon area utilized by system 10'. Although in this example a limiter is used, a high resolution analog-to-digital converter may also be used with full precision digital cosine correlator 12 and digital sine correlator 14 or an analog continuous time implementation of system 10' could be utilized. However, as shown in FIG. 4, curve 210 shows the improved output SNR of system 10' employing limiter 113.

Curve 212 shows the output SNR obtained with FSK demodulator system 10', FIG. 3, when a high resolution analog-to-digital converter with full precision digital cosine correlator 12 and digital sine correlator 14 is used or an analog continuous time implementation of system 10 is employed. Curve 214, FIG. 4, shown for reference, is input SNR to system 10' for both curves 210 and 212 and is measured at the output of IF filter 150, FIG. 3. The SNR is improved in curve 210 because the limiter 113, removes the AM noise at the input to multipliers 68, 70, 72 and 74. When analog-to-digital converter 25 includes limiter 113, as discussed above, the SNR of the tuned spectral response is maximized at low to medium input power, as shown by curve 210, FIG. 4.

Figure 5:
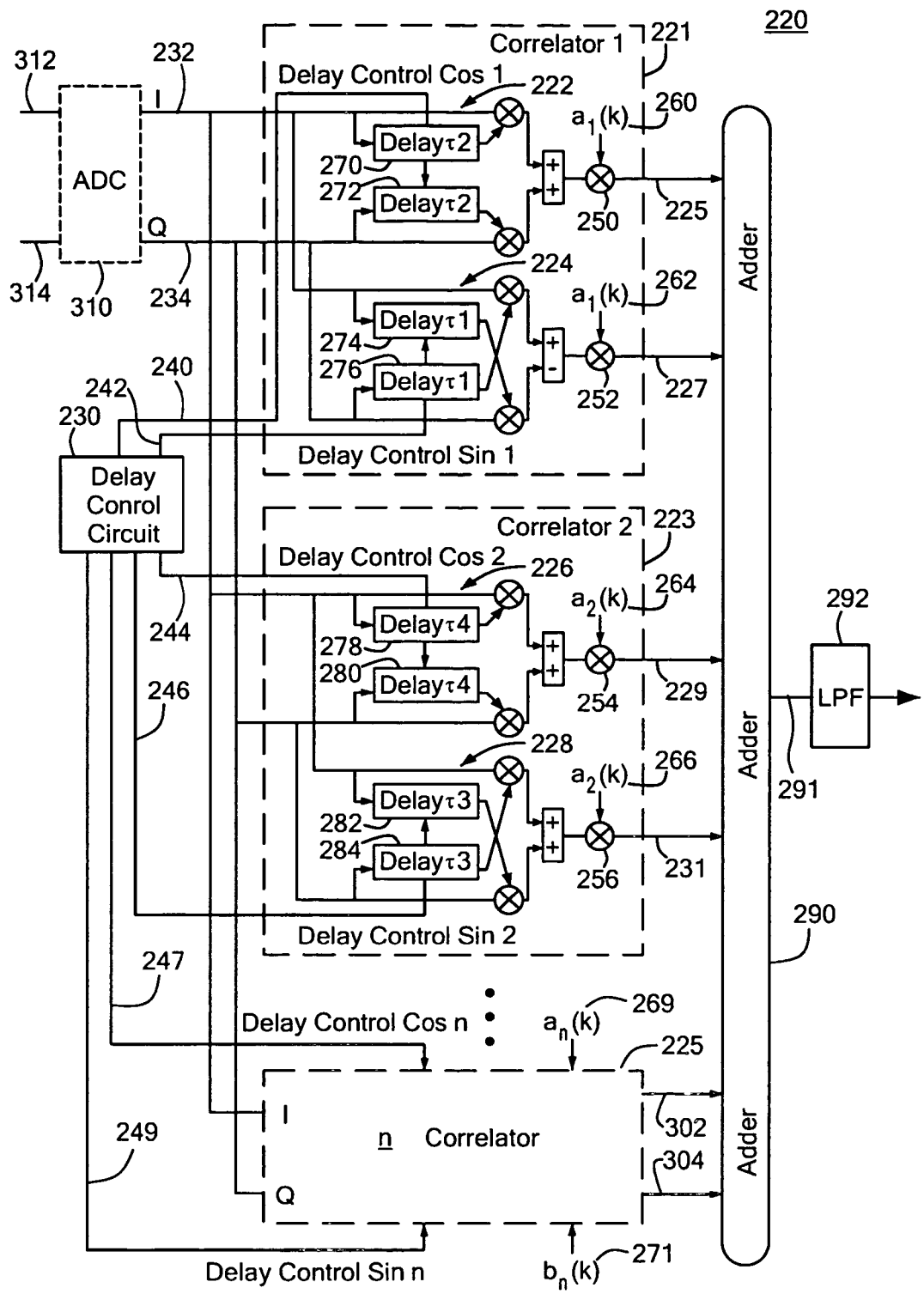
FIG. 5 is a schematic block diagram showing another embodiment of the FSK demodulator system of this invention using a plurality of quadri-correlators to generate a composite spectral response that combines the outputs of each of the plurality of correlators and approximates a matched filter response.
Figure 6:
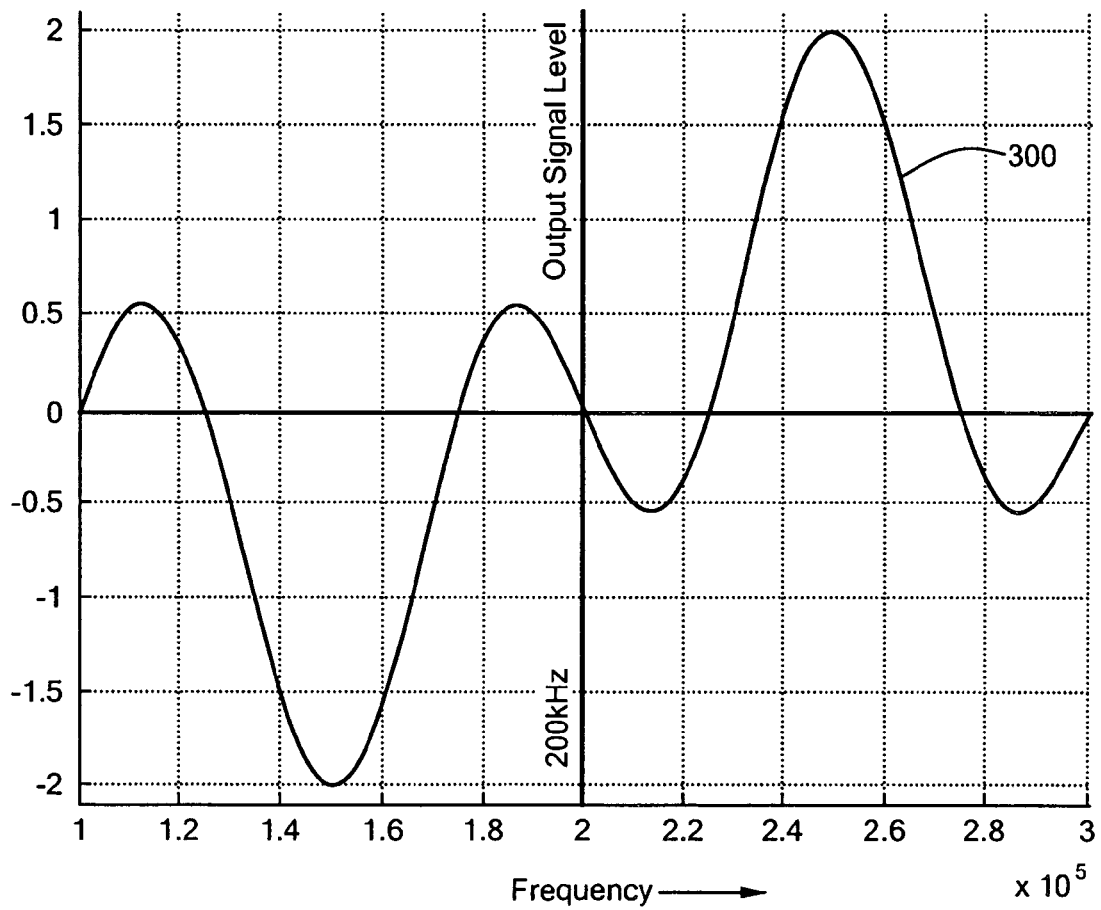
FIG. 6 is a graph showing an example of the tuned spectral response of the FSK demodulator system shown in FIG. 5.

In this example, the improved signal to noise ratio is improved by as much as 10 dB, as indicated by the difference depicted by line 216. FSK demodulator system 220, FIG. 5 of this invention may also include a plurality of correlators, e.g., correlators 221, 223 and 225 which each may include a sine and cosine correlator separately controlled by delay control circuit 230 to generate a further enhanced programmable tuned spectral response and further improve and maximize the output SNR of system 220. For example, system 220 may include correlator 221 which includes a pair of correlators, such as cosine correlator 222 and sine correlator 224 responsive to quadrature signals on lines 232 and 234. System 220 may also include correlator 223 which includes cosine correlator 226 and sine correlator 228 responsive to quadrature signals on lines 232 and 234. System 220 may include any number of correlators, e.g., n correlator 225, which may include a cosine and sine correlator responsive to quadrature signals on lines 232 and 234. As each correlator is added to system 220, the spectral shaping of system 220 is improved and system 220 approaches the performance of a match filter, as discussed below. The only limit to the number of correlators which can be added is power dissipation, silicon area and cost considerations. Cosine correlator 222 is controlled by delay control circuit 230 on line 240, sine correlator 224 is controlled by a delay on line 242, cosine correlator 226 is controlled by the delay on line 244, and sine correlator 228 is controlled by the delay on 246. The delays for the sine correlator and cosine correlator of n correlator 225 are controlled by the delay on lines 247 and 249. Similar as described above with reference to FIGS. 1 and 3, the delay signal on line 240, FIG. 5 sets a programmable delay, $\tau_2$, to delay circuits 270 and 272, the delay on line 242 sets a programmable delay, $\tau_1$, to delay circuits 274 and 276, the delay on line 244 sets a programmable delay, $\tau_4$, to delay circuits 278 and 280, and the delay on line 246 sets a programmable delay, $\tau_3$, to delay circuits 282 and 284. Similarly, the delays on lines 247 and 249 are used to set programmable delays for the delay circuits (not shown) in n correlator 225. Scaling circuits 250, 252, 254, and 256 are connected to the outputs of correlators 222, 224, 226 and 228, respectively, and introduce scaling coefficients, e.g., $a_1(k)$, indicated at 260, $b_1(k)$, indicated at 262, $a_2(k)$, indicated at 264, and $b_2(k)$, indicated at 266 to the correlators 222, 224, 226 and 228, respectively, to weight the outputs of each of correlators 222, 224, 226 and 228 and generate weighted signals on lines 225, 227, 229 and 231, respectively. Similarly, scaling coefficients $a_n(k)$, indicated at 269, and $b_n(k)$ may be introduced to n correlator 225 which may provide weighted signals on lines 302 and 304. Adder circuit 290 linearly combines the weighted signals on lines 225, 227, 229, 231, 302 and 304 to provide a linearly combined composite spectral response on line 291 that combines the outputs of each of correlators 221, 223 and 225, e.g., cosine correlator 222, sine correlator 224, cosine correlator 226 and sine correlator 228, and approximates a matched filter response. Low pass filter 292 is a post demodulator filter that removes noise and harmonics from the demodulated signal on line 291.

Similar as described above, FSK demodulator 220 may also include analog-to-digital converter (ADC) 310, similar as described above with reference to FIGS. 1 and 3, responsive to first and second quadrature signals on lines 312 and 314 at a predetermined IF frequency varied by positive and negative frequency deviations which converts the quadrature signals on lines 312 and 314 to digital quadrature signals on lines 232 and 234. Ideally, analog-to-digital converter 310 is a limiter or a saturated analog-to-digital converter.

An example of one such composite spectral response is shown by graph 300. In this example, the FSK system 220 maximizes the output SNR by providing a frequency response that approximates two Sinc functions that are centered at frequencies 150 kHz and 250 kHz. In this example, system 220 provides a composite frequency response that approximates a matched filter detector based on IF center frequency of 200 kHz with an FSK frequency deviation of 50 kHz and a data rate of 25 kbps. In this example, only two coefficients $b_1(k)$ and $b_2(k)$ are used to provide the composite spectral response shown in graph 300. All other coefficients are equal to zero.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

Other embodiments will occur to those skilled in the art and are within the following claims:

What is claimed is:

1. An FSK demodulator system with tunable spectral shaping comprising:
   a pair of quadri-correlators responsive to first and second quadrature signals, one of said pair deriving first and second signals representative of the frequency deviation of said quadrature signals at even integer multiples of said frequency deviation and for resolving the modulated FSK data represented by said quadrature signals and the other of said pair deriving first and second signals representative of the frequency deviation of said quadrature signals at odd integer multiples of said deviation frequency and for resolving the modulated FSK data represented by said quadrature signals; and
   a delay control circuit for setting a delay to each of said pair of quadri-correlators to control said first and second signals representative of the frequency deviation of said quadrature signals derived by each of said pair of quadri-correlators and generate a tuned spectral response at both even and odd integer multiples of said frequency deviation.

2. The FSK demodulator system of claim 1 further including an analog-to-digital converter responsive to first and second quadrature signals at a predetermined IF frequency varied by positive and negative frequency deviations for generating digital said first and second quadrature signals.

3. The FSK demodulator system of claim 1 further including a plurality of scaling circuits responsive to said pair of quadri-correlators for introducing programmable scaling coefficients to the output of each of said pair correlators to weight said first and second signals representative of the frequency deviation generated by each of said pair of correlators to generate a composite tuned spectral response that combines said even and odd integer multiples of said frequency deviation.

4. The FSK demodulator system of claim 1 in which one of said pair of quadri-correlators includes a cosine correlator.

5. The FSK demodulator system of claim 1 in which one of said pair of quadri-correlators includes a sine correlator.

6. The FSK demodulator system of claim 5 in which said delay circuit generates a programmable delay for said sine correlator which is equal to $\tau_1$, where $$\tau_1 = \frac{1}{4(f_{dev})},$$

and where $f_{dev}$ is said frequency deviation.

7. The FSK demodulator system of claim 4 in which said delay circuit generates a programmable delay for said cosine correlator which is equal to $\tau_2$, where $$\tau_2 = \frac{1}{4(f_{dev})},$$

and where $f_{dev}$ is said frequency deviation.

8. The FSK demodulator system of claim 2 in which said frequency deviation is optimized to equal the said IF frequency divided by a predetermined number.

9. The FSK demodulator system of claim 8 in which said predetermined number is chosen from the group consisting of: an odd integer, an even integer, and a real number.

10. The FSK demodulator system of claim 1 in which said frequency deviation has a frequency in the range of about 100 Hz to 5 MHz.

11. The FSK demodulator system of claim 3 in which said scaling coefficients are values between −1 and +1.

12. The FSK demodulator system of claim 3 further including an adder circuit responsive to said plurality of scaling circuits for linearly combing the outputs of said pair of correlators to provide a said composite spectral response and maximize the output signal-to-noise ratio.

13. The FSK demodulator system of claim 2 in said IF frequency is greater than zero.

14. The FSK demodulator system of claim 2 in which said IF frequency is in the range of about 100 kHz to 10 MHz.

15. The FSK demodulator system of claim 2 in which the said IF frequency is zero.

16. The FSK demodulator system of claim 2 in which said analog-to-digital converter includes a limiter.

17. The FSK demodulator system of claim 2 in which said analog-to-digital converter includes a one bit analog-to-digital converter.

18. The FSK demodulator system of claim 2 in which said analog-to-digital converter includes a saturated analog-to-digital converter.

19. The FSK demodulator system of claim 4 in which said cosine correlator is responsive to first and second quadrature signals and generates a cosine frequency response.

20. The FSK demodulator system of claim 4 in which the ratio of an IF frequency to said frequency deviation is an odd integer multiple.

21. The FSK demodulator system of claim 4 in which the ratio of an IF frequency to said frequency deviation is a real number.

22. The FSK demodulator system of claim 5 in which said sine correlator is responsive to first and second quadrature signals and generates a sinusoidal frequency response.

23. The FSK demodulator system of claim 5 in which the ratio of an IF frequency to said frequency deviation is an even integer multiple.

24. The FSK demodulator system of claim 5 in which the ratio of an IF frequency to said frequency deviation is a fractional number or a real number having a fractional part greater than zero.

25. The FSK demodulator system of claim 1 in which each of said pair of quadri-correlators includes first and second delay circuits responsive to said first and second quadrature signals for generating delayed first and second quadrature signals, first and second multiplier circuits responsive to said first and second quadrature signals and first and second delayed quadrature signals for deriving first and second signals representative of the frequency deviation of the quadrature signals, and a summer circuit responsive to said first and second signals representative of the frequency deviation of said quadrature signals for resolving the digital values represented by said quadrature signals.

26. The FSK demodulator system of claim 3 in which said system operates at a modulation index in the range of about 0.1 to 50.

27. The FSK demodulator system of claim 26 in which said delay and said scaling coefficients are adjusted to maximize the output signal-to-noise ratio over a modulation index in the range of about 0.1 to 50.

28. The FSK demodulator system of claim 1 in which said FSK demodulator system enables FSK demodulation, and/or Gaussian Frequency Shift Keying (GFSK) demodulation and/or Minimum Shift Keying (MSK) demodulation, and/or Phase Shift Keying (PSK) demodulation.

29. The FSK demodulator system of claim 12 further including a low pass filter responsive to said adder circuit for removing noise and harmonics from said tuned spectral response.

30. The FSK demodulator system of claim 29 further including a slicer circuit responsive to said low pass filter for recovering said modulated FSK data and generating a recovered bit stream.

31. The FSK demodulator system of claim 30 further including a digital PLL responsive to said recovered bit stream for generating a clock signal and a data signal.

32. The FSK demodulator system of claim 2 further including a quadrature receiver responsive to a high frequency FSK signal varied by positive and negative frequency deviations which represent modulated FSK data for converting said high frequency FSK signal to said first and second quadrature signals at said predetermined IF frequency.

33. An FSK demodulator system with tunable spectral shaping comprising:
    a limiter responsive to a first and second quadrature signals at a predetermined IF frequency varied by a positive and negative frequency deviations for generating digital first and second quadrature signals;
    a pair of quadri-correlators responsive to said digital first and second quadrature signals, one of said pair deriving first and second signals representative of the frequency deviation of said quadrature signals at even integer multiples of said frequency deviation and for resolving the modulated FSK data represented by said quadrature signals and the other of said pair deriving first and second signals representative of the frequency deviation of said quadrature signals at odd integer multiples of said deviation frequency and for resolving the modulated FSK data represented by said quadrature signals; and
    a delay control circuit for setting a delay to each of said pair of quadri-correlators to control said first and second signals representative of the frequency deviation of said quadrature signals derived by each of said pair of quadri-correlators and generate a tuned spectral response at both even and odd integer multiples of said frequency deviation.

34. An FSK demodulator system with tunable spectral shaping comprising:
    an analog-to-digital converter responsive to first and second quadrature signals at a predetermined IF frequency varied by positive and negative frequency deviations for generating digital first and second quadrature signals;
    a sine and cosine pair of quadri-correlators responsive to said digital first and second quadrature signals each of said pair deriving first and second signals representative of the frequency deviation of said quadrature signals at even or odd integer multiples or sub-multiples of said frequency deviation about said IF frequency and for resolving the modulated FSK data represented by said quadrature signals;
    a delay control circuit for setting a delay to each of said sine and cosine pair of quadri-correlators for controlling said first and second signals representative of the frequency deviation of said quadrature signals; and
    a plurality of scaling circuits responsive to said sine and cosine pair of quadri-correlators for introducing programmable scaling coefficients to the output of each of said pair correlators to weight said first and second signals representative of the frequency deviation generated by each of said pair of correlators to generate a composite tuned spectral response that combines said even and odd integer multiples of said frequency deviation.

35. The FSK demodulator system of claim 34 further including an adder circuit responsive to said plurality of scaling circuits for lineally combining the outputs of said sine and cosine pair of quadri-correlators to generate said composite spectral response.

36. The FSK demodulator system of claim 34 further including a qaudrature receiver responsive to a high frequency FSK signal varied positive and negative frequency deviations which represent modulated FSK data for converting said high frequency FSK signal to said first and second quadrature signals at said predetermined IF frequency.

37. The FSK demodulator system of claim 34 in which said analog-to-digital converter includes a limiter.

38. The FSK demodulator system of claim 34 in which said analog-to-digital converter includes a saturated analog-to-digital converter.

39. An FSK demodulator system with tunable spectral shaping comprising:
a analog-to-digital converter responsive to a first and second quadrature signals at a predetermined IF frequency varied by a positive and negative frequency deviations for generating digital first and second quadrature signals;
a sine and cosine pair of quadri-correlators responsive to said digital first and second quadrature signals each of said pair deriving first and second signals representative of the frequency deviation of said quadrature signals at even or odd integer multiples or sub-multiples of said frequency deviation about said IF frequency and for resolving the modulated FSK data represented by said quadrature signals;
a delay control circuit for setting a delay to each of said sine and cosine pair of quadri-correlators for controlling said first and second signals representative of the frequency deviation of said quadrature signals;
a plurality of scaling circuits responsive to said sine and cosine pair of quadri-correlators for introducing programmable scaling coefficients to the output of each of said pair correlators to weight said first and second signals representative of the frequency deviation generated by each of said pair of correlators; and
an adder circuit responsive to said plurality of scaling circuits for lineally combining the outputs of said sine and cosine pair of quadri-correlators to generate a composite spectral response that combines said even and odd integer multiples of said frequency deviation.

40. An FSK demodulator system with tunable spectral shaping comprising:
a plurality of correlators, each said correlator including a sine and cosine correlator responsive to first and second quadrature signals at a predetermined IF frequency varied by positive and negative frequency deviations, each of said sine and cosine correlators deriving first and second signals representative of the frequency deviation of said quadrature signals at even or odd integer multiples or sub-multiples of said frequency deviation about said IF frequency and for resolving the modulated FSK data represented by said quadrature signals;
a delay control circuit for setting a programmable delay to each of said sine and cosine correlators for controlling and maximizing said first and second signals representative of the frequency deviation of said quadrature signals; and
a plurality of scaling circuits responsive to each of said sine and cosine correlators for introducing programmable scaling coefficients to the output of each of said sine and cosine correlators to weight said first and second signals representative of the frequency deviation generated by each of said sine and cosine correlators and generate a lineally combined composite spectral response that combines the outputs of each of said plurality of correlators and approximates a matched filter response.

41. An FSK demodulator system with tunable spectral shaping comprising:
a analog-to-digital converter responsive to a first and second quadrature signals at a predetermined IF frequency varied by a positive and negative frequency deviations for generating digital first and second quadrature signals;
a plurality of correlators, each said correlator including a sine and cosine correlator responsive to said digital first and second quadrature signals at a predetermined IF frequency, each of said sine and cosine correlators deriving first and second signals representative of the frequency deviation of said quadrature signals at even or odd integer multiples or sub-multiples of said frequency deviation about said IF frequency and for resolving the modulated FSK data represented by said quadrature signals;
a delay control circuit for setting a programmable delay to each of said sine and cosine correlators for controlling and maximizing said first and second signals representative of the frequency deviation of said quadrature signals; and
a plurality of scaling circuits responsive to each of said sine and cosine correlators for introducing programmable scaling coefficients to the output of each of said sine and cosine correlators to weight said first and second signals representative of the frequency deviation generated by each of said sine and cosine correlators and generate a lineally combined composite spectral response that combines the outputs of each of said plurality of correlators and approximates a matched filter response.

42. The FSK demodulator system of claim 41 further including an adder circuit responsive to said plurality of scaling circuits for lineally combining the outputs of each of said plurality of correlators for generating said lineally combined composite response.

43. The FSK demodulator system of claim 41 in which said analog-to-digital converter includes a limiter.

44. The FSK demodulator system of claim 41 in which said analog-to-digital converter includes a saturated analog-to-digital converter.

45. The FSK demodulator system of claim 41 further including a low pass filter response to said adder circuit for removing noise and harmonics from said lineally combined composite response.

46. An FSK demodulator method comprising the steps of:
deriving first and second signals representative of the frequency deviation of first and second quadrature signals at even integer multiples of the frequency deviation and resolving the modulated FSK data represented by the quadrature signals;
deriving first and second signals representative of the frequency deviation of first and second quadrature signs at odd integer multiples of the frequency deviation and resolving the modulated FSK data represented by the quadrature signals; and
setting a delay to control the first and second signals representative of the frequency deviation at the even and odd multiples of the frequency deviation to generate a tuned spectral response at both even and odd integer multiples of the frequency deviation.

47. The method of claim 45 further including the step of introducing scaling coefficients to weight said first and second signals representative of the deviation frequency at even or odd integer multiples or sub-multiples the frequency deviation about a predetermined IF frequency to generate a composite spectral response that combines said even and odd integer multiples of said deviation frequency.

* * * * *